United States Patent [19]

McDowell

[11] Patent Number: 4,503,930

[45] Date of Patent: Mar. 12, 1985

[54] LOUDSPEAKER SYSTEM

[76] Inventor: Vaughn P. McDowell, Rte. 2, Box 475, Fredericksburg, Va. 22405

[21] Appl. No.: 414,662

[22] Filed: Sep. 3, 1982

[51] Int. Cl.[3] ........................ H05K 5/00

[52] U.S. Cl. ........................ 181/145; 181/147; 181/175; 181/199

[58] Field of Search ........................ 181/144–147; 179/1 E

[56] References Cited

U.S. PATENT DOCUMENTS

| | | | |
|---|---|---|---|
| 2,927,657 | 3/1960 | Patla et al. | 181/145 |
| 3,582,553 | 6/1971 | Bose | 181/147 |
| 4,146,745 | 3/1979 | Froeschle et al. | 181/145 X |
| 4,365,688 | 12/1982 | Blose | 181/145 |

*Primary Examiner*—L. T. Hix
*Assistant Examiner*—Brian W. Brown
*Attorney, Agent, or Firm*—W. Brown Morton, Jr.

[57] ABSTRACT

A loudspeaker system for use in stereo sound reproduction which is adapted to reflect all higher frequency sounds off a reflecting surface before the sounds reach a listener. The system comprises two enclosures, each having two compartments. The lower compartment houses the woofer; the upper compartment contains at least two arrays of at least two acoustic speakers, each array being positioned vertically relative to each other and projecting in the same general direction. The arrays are positioned in the enclosure such that the arrays project at a moderately divergent angle relative to each other and are spaced at least one array width from each other. The portion of the enclosure between the arrays is essentially pervious to sound and thus permits sound generated by the speakers which has been reflected from the reflecting surface to pass through the enclosure.

5 Claims, 11 Drawing Figures

LOUDSPEAKER SYSTEM

GLOSSARY

In this application, the following listed terms are used with the meanings set forth after them:

Loudspeaker—an assemblage comprising a cabinet providing an enclosure for a plurality of individual sound-producing devices and support for passive elements such as grille cloth, baffles, and acoustically-absorbent lining and the devices and passive elements enclosed in and/or supported by the cabinet.

Speaker—a sound-producing device.

Woofer—a low-base speaker, e.g. 200 hz. or less.

Acoustic speaker—a speaker producing higher frequency sounds than are produced by a woofer.

Full range speaker—an acoustic speaker producing medium base to high frequency sounds.

Tweeter—an acoustic speaker producing only high frequency sounds.

Driver—a speaker.

TECHNICAL FIELD

The technical field of this invention relates generally to loudspeakers and, more particularly, to loudspeakers adapted for use in home entertainment audio systems or for amplification at live performances and capable of providing a full and complete stereo image which appears to a listener to be emanating from a source remote from the actual loudspeakers and which can be perceived throughout a listening area.

BACKGROUND ART

The design and production of loudspeakers for stereo audio systems is an art which is constantly changing in an effort to provide a loudspeaker which can simulate a live musical performance as closely as possible. In order to do so, the stereo loudspeakers should provide a sharp stereo image, i.e., a spatial recreation of the distribution of the components of the performance, and a multidirectional coverage of the stereo image such that the image can be perceived by a listener from virtually any position relative to the loudspeakers.

Several factors are vital to the production of a sharp stereo image. These are the listener's ability to determine the direction of a sound source, the utilization of an effective point source, and the elimination of secondary, or phantom, sources (diffraction and unwanted reflections). These tend to blur the point source, creating false imagery, as if another speaker were present.

The crest of the first sound wave reaching the listener's ear is critical in determining the direction of the sound source (and hence, stereo imagery). This is especially true in frequencies upward of around 200 hz., becoming more pronounced as the frequency increases. In frequencies downward from 200 hz., the human ear is incapable of determining the direction of the sound source.

The ideal stereo system is based upon two point sources in order to achieve an ideally sharp stereo image. In physical reality, a true point source is extremely hard to achieve, since sound usually emanates from a large area rather than from a point.

The closest practical means of approximating a point source is derived through use of a boundary controlled virtual image, whereby the construction of the cabinet (later described) allows the listener only to hear certain portions of the virtual image from each listening angle.

Thus a pair of such cabinets will maintain a sharp stereo image in a multidirectional coverage throughout the listening area. This allows the listener the freedom of perceiving a sharp stereo image (since he hears only the virtual image) regardless of his position relative to the listening area.

Unwanted secondary sources (which tend to spread the ideal point source) are eliminated by lining the cabinet with acoustically absorbent material. This, in effect, "soaks up" unwanted sound and enhances the stereo image through the elimination of any fuzzy or blurred images. One interesting design approach for attempting to simulate a live performance from a stereo loudspeaker is that embodied in the loudspeaker sold commercially under the tradename of the Bose 901. This loudspeaker contains a plurality of acoustic speakers which are positioned in the loudspeaker enclosure such that one speaker projects sound in a forward direction, i.e., directly toward a listener, and the remainder of the speakers, grouped in two arrays with a slight angular displacement from each other, project sound rearwardly such that projected sound will strike one or more walls and be reflected before reaching a listener. The concept behind this loudspeaker design is that in a live performance in a concert hall or the like, only a relatively small proportion of the sound generated reaches the listener directly as the greater portion is first reflected from the walls, ceiling and floor of the building where the performance is occurring before reaching the listener. Thus, by placing a majority of the acoustic speakers such that projected sound is directed toward a wall and then reflected and by having sound from only one acoustic speaker reaching a listener directly, a live performance within a building is thereby supposedly simulated.

By having the rearwardly directed speakers reflect sound off adjacent walls these loudspeakers tend to create what can be termed a "virtual image", i.e., an audio image of the sound from the rearwardly directed speakers which, to a listener, appears to be emanating from a source located behind the wall at which the speakers are aimed. This virtual image seemingly is located a distance behind the wall that is equal to the distance between the loudspeaker and the wall and on a line normal to the wall through the loudspeaker. The creation of the virtual image thus tends to separate the source of the sound from the loudspeaker itself.

While the above-described loudspeaker operates satisfactorily in many respects, there are certain listening positions where the physical presence of the loudspeaker itself tends to block or impede portions of the reflected sound from the virtual image created by the rearwardly directed speakers thereby producing certain locations where listening is less than optimal. In addition, the provision of the single forwardly directed speaker tends to reduce or blur the virtual image created by the rearwardly directed speakers and tends to degrade the stereo imagery since both direct and reflected sounds are heard by a listener.

It is a purpose of the present invention to allow the listener to hear only the virtual image of a feasibly approximated point source throughout the listening area. This is achieved by maximizing use of the virtual image through elimination of all secondary sources within the speaker cabinet and by allowing the cabinet itself to become pervious to the virtual image. Thus, the past disadvantages associated with reflected sound have not merely been overcome; they have been turned to advantage.

DISCLOSURE OF INVENTION

It is therefore a feature of the present invention to provide a loudspeaker which is adapted to produce a reflected virtual image which is less impeded by the physical presence of the loudspeaker.

It is another feature of the present invention to provide a loudspeaker wherein all of the higher frequency sound from the loudspeaker is adapted to be reflected from a reflecting surface before reaching a listener.

It is yet another feature of the present invention to provide loudspeakers which, when used in a pair, are capable of providing a sharp stereo image that is not confined to a particular listening position but can be perceived throughout an entire listening area.

Briefly, the present invention in its broader aspects comprehends a loudspeaker comprising an enclosure having a compartment containing at least two arrays of at least two speakers, the speakers of each array being positioned vertically relative to each other and projecting in the same general direction, the arrays being positioned in the enclosure such that the arrays project at an acute angle relative to each other and are spaced at least one array width from each other, the portion of the enclosure between the arrays being essentially pervious to sound and capable of conducting sound generated by the speakers which has been reflected from a reflecting surface through the enclosure.

Additional features, objects and advantages of the present invention will become more fully apparent from a detailed consideration of the arrangement and construction of the loudspeakers as set forth in the following specification taken together with the accompanying drawing.

BEST MODE FOR CARRYING OUT INVENTION

Figure 1:
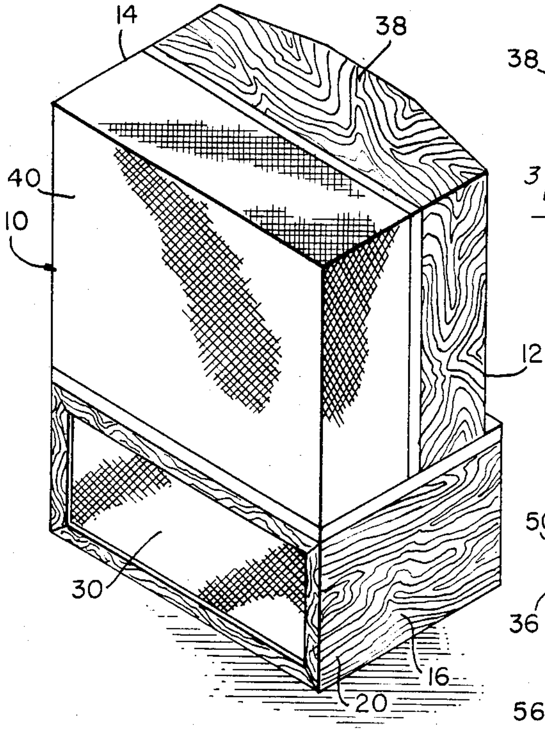
FIG. 1 is a perspective view of one embodiment of a loudspeaker system in accordance with the present invention.
Figure 2:
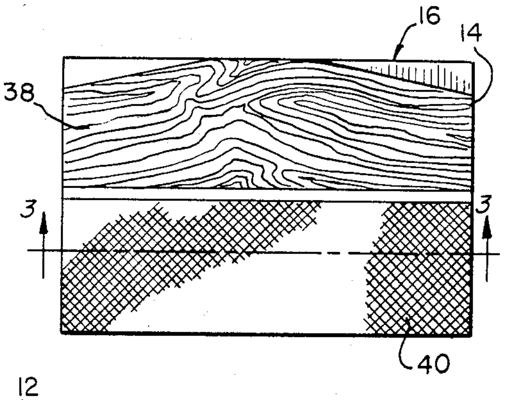
FIG. 2 is a top view of the loudspeaker enclosure of FIG. 1.
Figure 3:
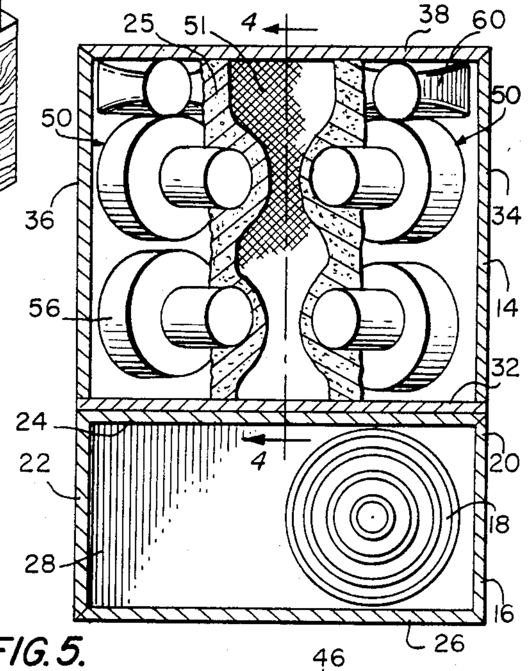
FIG. 3 is a front view, partially in section, of the system of FIG. 1 taken along line 3—3 of FIG. 2.

Referring now to FIGS. 1 through 5, there shown is one embodiment of a loudspeaker in accordance with the present invention. Loudspeaker 10 comprises enclosure 12 having upper compartment 14 and lower compartment 16. As is best shown in FIG. 3, lower compartment 16 contains a bass speaker or "woofer" 18 and is defined by rigid sidewalls 20 and 22, rigid top and bottom walls 24 and 26, rigid back wall 28, and front grille 30 which is acoustically pervious or open. Preferably, walls 20 through 28 are of wood or similar material so as to provide structural rigidity for lower compartment 16.

Figure 5:
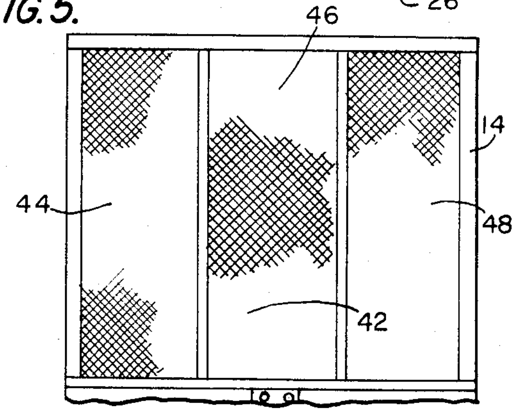
FIG. 5 is a rear view of the upper portion of the loudspeaker enclosure of FIG. 1.

Upper compartment 14 of enclosure 12 is defined by bottom 32, vertical walls 34 and 36, top 38, all of rigid material such as wood or the like, and front and rear grilles 40 and 42 respectively. Front grille 40 extends over the entire front of upper compartment 14 as well as to portions of both sides and the top of the compartment. As is best shown in FIG. 5, rear grille 42 is subdivided into three non-parallel surfaces 44, 46 and 48.

Located within upper compartment 14 are two vertical arrays 50 of acoustic speakers, one array being located behind surface 44 of rear grille 42 and the other array behind surface 48 of the rear grille. The axes or projecting directions of all of the speakers forming one array 50 are the same. The speakers of arrays 50 are also mounted such that the axes are normal to the respective grille surface 44 or 48 and thus the speaker axes of one array form an acute angle with the speaker axes of the other array when viewed from above. Arrays 50 are separated from each other a sufficient distance such that a substantial void or acoustically pervious space 51 exists between the two arrays, the space generally being equal to or greater in width than the width of one array. Space 51 is capable of conducting sound through enclosure 12.

Figure 4:
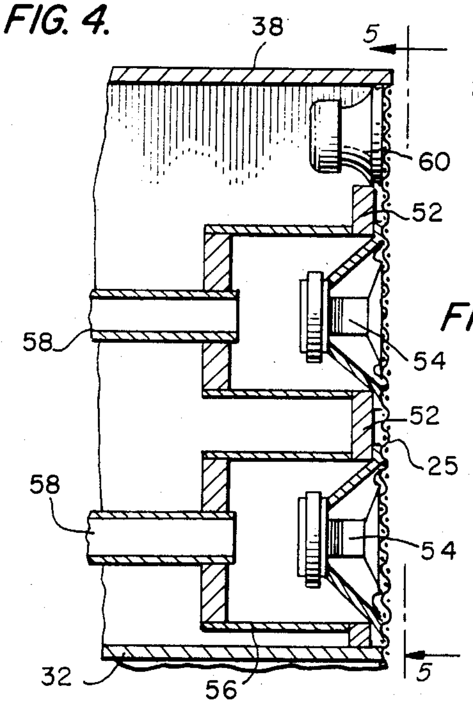
FIG. 4 is a cross-sectional side view of a portion of the system of FIG. 1 taken along line 4—4 of FIG. 3.

The particular type of speaker used in arrays 50 may vary considerably but generally at least some of the speakers are conventional full-range speakers which are designed to accommodate medium bass to high audio frequencies. As is best shown in FIG. 4, each vertical array 50 in this embodiment is mounted on support frame 52 and comprises two full-range speakers 54, each surrounded by helmholtz resonator 56 with acoustic inductor 58, and one piezoelectric tweeter 60. The number of speakers in each array 50 may also vary, three being presently preferred.

Loudspeaker 10 is particularly adapted to propagate sound when the loudspeaker is positioned such that the exterior surface 46 of the rear grille 42 is parallel to and facing an acoustically reflective surface such as a wall or the like and when the loudspeaker is located between a listener and the reflective surface. In such an orientation, sound from woofer 18 projects directly to the listener while sound emanating from arrays 50 reaches the listener after being reflected from the reflective surface as is explained in more detail hereinafter. For stereo sound reproduction, generally two loudspeakers 10 are employed, both speaker arrays 50 of one loudspeaker being connected to one channel of a suitable stereo signal generating apparatus (not shown) and both arrays of the other loudspeaker being connected to the second channel.

Figure 6:
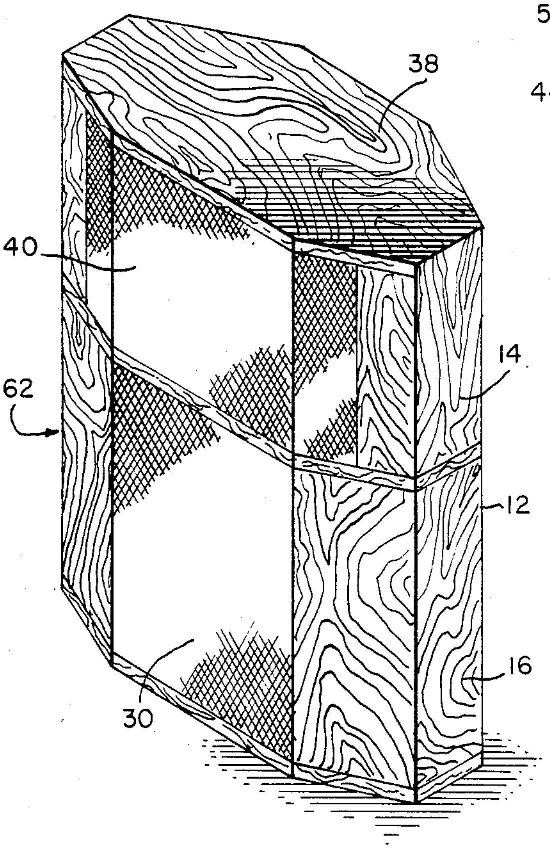
FIG. 6 is a perspective view of another embodiment of a loudspeaker system in accordance with the subject invention.
Figure 7:
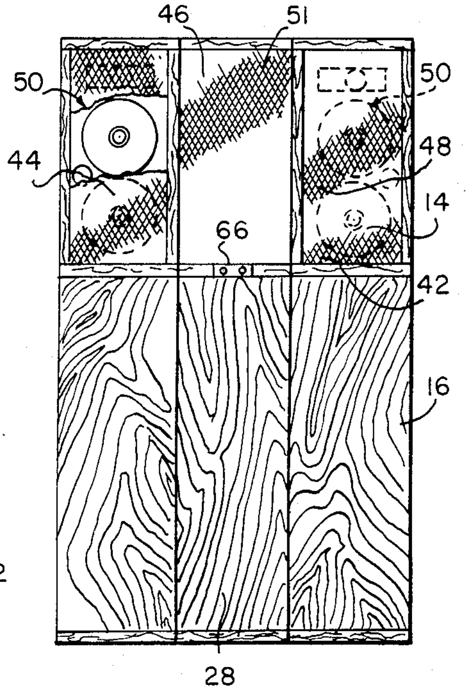
FIG. 7 is a rear view of the loudspeaker enclosure of FIG. 6.
Figure 8:
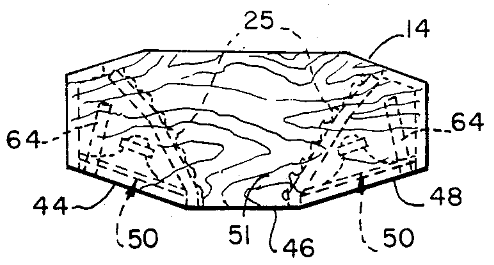
FIG. 8 is a top view of the loudspeaker enclosure of FIG. 6 which illustrates in phantom the location of the full-range speakers.

Referring now to FIGS. 6 through 8, there shown is loudspeaker 62 which is another embodiment of a loudspeaker in accordance with the invention. In many respects, loudspeaker 62 is identical with loudspeaker 10 and as a consequence, identical numbering for like components is used in its description. Enclosure 12 of loudspeaker 62 is of slightly different configuration than that of loudspeaker 10 as both the front and rear of the enclosure are divided into three non-coplanar surfaces. Such a configuration improves frequency response and helps to eliminate sound diffraction as described in a condensation of a work of H. F. Olson of the RCA Princeton Laboratories appearing as Question 20.77 beginning on page 1111 of The Audio Cyclopedia (Howard W. Sams and Co., Inc. Indianapolis, 1978). Enclosure 12 comprises upper compartment 14 and lower compartment 16 which houses a low-range or bass speaker (not shown) behind grille 30. Upper compartment 14 contains two vertical arrays 50 of speakers positioned behind surfaces 44 and 48 of rear grille 42 such that the speakers in each array project in the same general direction. Arrays 50 are separated from each other by the width of surface 46 of rear grille 42 thereby providing for acoustically pervious space 51 extending through the loudspeaker 62. As is shown in FIG. 8, each array 50 is provided with reactive air column 64. Binding posts 66 provide a convenient point for electrical connection between loudspeaker 62 and associated audio generating apparatus (not shown).

In loudspeakers 10 and 62, frames 52 for supporting speaker arrays 50, as well as space 51 and internal components such as resonators 56, may be lined or covered with a sound absorbent material 25 so that diffracted and/or a multiple of the reflected sound is absorbed which could otherwise detract from the stereo imagery created by the loudspeakers.

The loudspeakers of the invention as illustrated by the embodiments of FIGS. 1 through 8 incorporate a number of features which contribute to their ability to produce a stereo sound which effectively simulates a live performance. The provision of utilizing a vertical array of speakers tends to closely approximate a point source which is the ideal theoretical manner for producing a sharp stereo image. The provision of the void space between the arrays tends to eliminate the loudspeaker enclosure from blocking or interfering with the sound as it is reflected from an acoustically reflective surface and allows the virtual image created by the loudspeakers to be perceived throughout the entire listening area around the loudspeakers. The creation of a virtual image effect by the speaker arrays projecting sound off a reflecting surface also tends to separate the source of sound as perceived by a listener from the loudspeakers themselves. The previously-mentioned width of the sound pervious space between the arrays allows sufficient volume for the sound from one entire virtual image, or complementary portions of both images, to be conducted without impedence through the enclosure to a listener. The above features of the loudspeakers of the invention are more clearly illustrated in FIGS. 9 and 10 of the drawing and the associated text.

Figure 9:
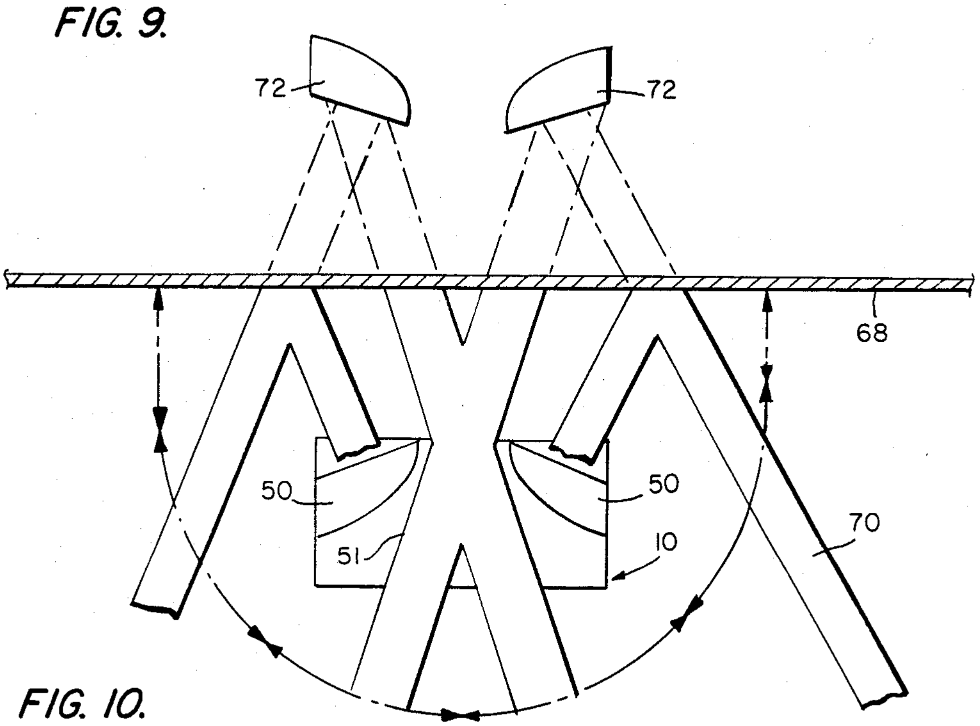
FIG. 9 illustrates the propagation of sound by a loudspeaker system such as that of FIG. 1 when located in proximity to a reflecting surface such as a wall.

FIG. 9 diagrammatically illustrates the propagation of sound by a loudspeaker such as loudspeaker 10 when the loudspeaker is placed in close proximity to acoustically reflective surface 68. Sound waves 70 emanating from the speakers of arrays 50 strike reflecting surface 68 thereby apparently creating acoustic virtual images 72 which appear to be located behind the reflecting surface and separate from the loudspeaker itself. The position of virtual images 72 appears to be generally on a line from array 50 normal to reflecting surface approximately the distance from the array to the reflecting surface. Sound waves 70 reflecting from surface 68 pass by either side of enclosure 12 as well as through acoustically pervious space 51. Thus, one virtual image 72 created by loudspeaker 10 may be perceived directly by a listener regardless of the position of the listener relative to the loudspeaker.

Figure 10:
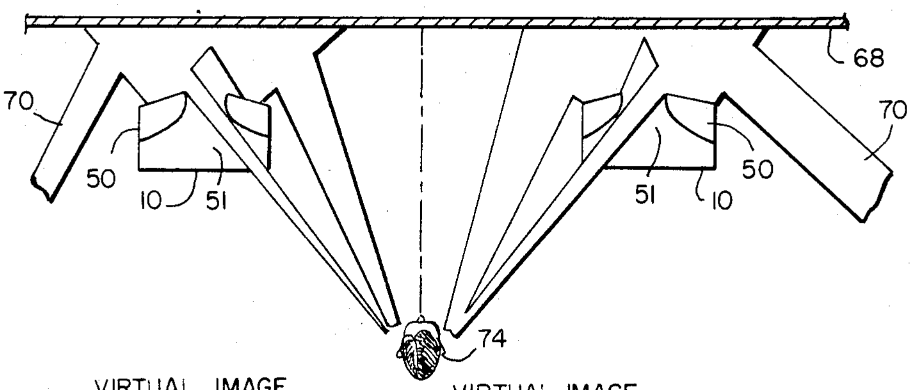
FIG. 10 illustrates the paths of sound waves generated by a pair of such loudspeakers in relation to a listener.

FIG. 10 is a diagrammatic illustration of how sound is received by a listener positioned on a line equidistant between a pair of loudspeakers 10 in accordance with the invention. As is apparent, in this position listener 74 can hear sound from both arrays 50 of left loudspeaker 10 as well as from both arrays of the right loudspeaker upon reflection from surface 68. The provision of void space 51 in loudspeakers 10 allows the listener the capability of hearing the reflected sound from the outermost array 50 of each loudspeaker. It should be recognized that the position of listener 74 in FIG. 10 is merely illustrative of the many listening positions where reflected sound may be directly heard.

Figure 11:
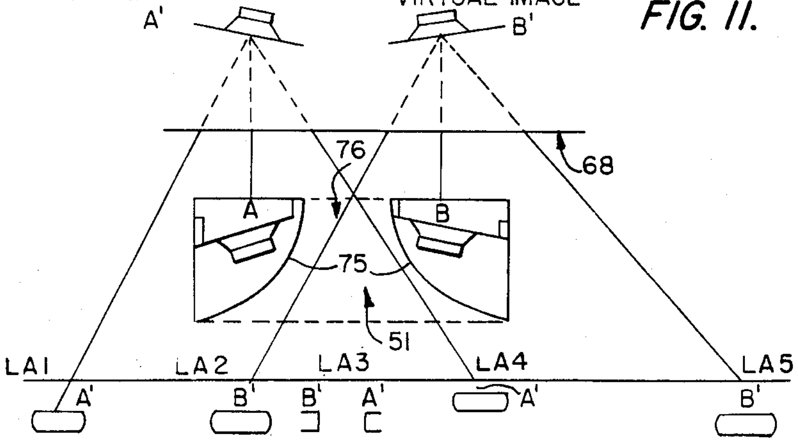
FIG. 11 illustrates how sound waves propagated according to FIG. 9 are perceived from five different listening angles, due to the "boundary control" of this invention.

To maintain the virtual image of the approximated point source throughout the listening area, the present invention employs the concept of boundary control, illustrated in FIG. 11.

The plurality of drivers in the upper section of the cabinet creates a wide dispersion of sound, compensating for the beaming of the upper frequencies in each individual speaker. This also creates a plurality of virtual images. Thus, the point source, as such, is destroyed. To overcome this problem, the cabinet is designed to maintain the perception of a thin virtual image at each listening position.

As shown in FIG. 11, for five exemplary listening angles, the listener is allowed to hear, in the upper frequencies, only a selected portion of the total virtual image, A′ plus B′. At listening angle LA1, only the virtual image A′ of array A is heard because virtual image B′ of array B is totally blocked by the back wall structure 75 of array B. Similarly, at listening angle LA5, only the virtual image B′ of array B is heard, virtual image A′ of array A being blocked by the back wall structure 75 of array A. At listening angle LA2, only the virtual image B′ of array B is heard because virtual image A′ of array A is again blocked by the back wall structure 75 of array A. Similarly, at listening angle LA4, only the virtual image A′ of array A is heard, virtual image B′ of array B being blocked by the back wall structure 75 of array B.

At listening angle LA3, on a line passing centrally between array A and array B normal to reflecting wall 68, it is still desirable for the listener to hear only thin virtual imagery. Hence, the acoustic aperture 76 allows only portions of the two virtual images A′ and B′ to be heard through void space 51. The combination appears to the listener to be as thin a source as either A′ or B′ heard alone. Thus, a thin virtual image is approximated.

Overall, the result is that the cabinet masks portions of the total virtual image at each listening angle to maintain the approximation of a thin vertical array (or, in practical terms, a point source). Therefore, the concept of a totally boundary controlled virtual image is realized.

Although the woofer in the illustrated embodiments of the invention is shown as being capable of projecting sound directly toward a listener, the woofer could be oriented in the same direction as the speaker arrays so that sound from the woofer would be reflected. It is, however, preferable to have the woofer directed toward the listener since standing waves may occur if sound from the woofer is reflected from an acoustically reflecting surface especially if the normal axis of the woofer is also normal to the wall. The preferred forward placement of the woofer does not interfere with the creation of a sharp stereo image by the loudspeakers because the human ear cannot generally distinguish the source of low frequency sounds, e.g., 200 hz. or less, such as those generated by a woofer. In addition, while the embodiments illustrated herein have utilized two vertical arrays of speakers in each loudspeaker, it is contemplated that the loudspeakers of the invention could include three or more arrays as long as acoustically pervious spaces are provided between adjacent arrays.

While there has been shown and described what is considered to be the preferred embodiments of the present invention, it will be apparent to those skilled in the art that various changes and modifications may be made therein without departing from the invention as defined in the appended claims.

I claim:

1. A loudspeaker comprising a cabinet providing an enclosure for an upper compartment containing at least two arrays of at least two acoustic speakers each, the corresponding speakers of each array being essentially at the same level within said compartment and positioned generally vertically relative to each other in their respective arrays and arranged to project sound from said enclosure in the same general direction, the arrays being positioned such that the arrays project at a substantial angle relative to each other and are spaced at least one array width from each other, and a vertically-extending portion of the space through the enclosure between the arrays being essentially unbaffled and hence pervious to sound and capable of conducting back through the enclosure sound projected by the speakers and reflected from a reflecting surface that is generally perpendicular to said direction, whereby an aperture freely conducting reflected sound through the cabinet is provided.

2. A loudspeaker in accordance with claim 1 further comprising a lower compartment containing a woofer capable of projecting sound in a direction generally opposite from the direction sound is projected from the arrays.

3. A loudspeaker in accordance with claim 1 wherein each array contains at least one full-range speaker and at least one tweeter.

4. A loudspeaker in accordance with claim 3 wherein the full-range speaker is enclosed in a helmholtz resonator fitted with an acoustic inductor.

5. A loudspeaker system employing two loudspeakers according to claim 1 in which the two loudspeakers are so positioned in a listening space having a reflecting wall as to be located generally on a line parallel to the wall and between a listener and the wall so that such a listener on a line generally perpendicular to the wall midway between the two loudspeakers perceives the reflected sound generating the virtual image of the outermost array of each loudspeaker through the cabinet aperture of each, respectively.

* * * * *